United States Patent
Verdun et al.

(10) Patent No.: US 9,263,912 B2
(45) Date of Patent: Feb. 16, 2016

(54) MITIGATING PREMATURE WEAR OUT OF A RECHARGEABLE BATTERY

(71) Applicant: Dell Products L.P., Round Rock, TX (US)

(72) Inventors: Gary Joseph Verdun, Georgetown, TX (US); Richard C. Thompson, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 451 days.

(21) Appl. No.: 13/759,266

(22) Filed: Feb. 5, 2013

(65) Prior Publication Data

US 2014/0217958 A1    Aug. 7, 2014

(51) Int. Cl.
*H02J 7/00* (2006.01)
*H02J 7/04* (2006.01)
*G01R 31/36* (2006.01)

(52) U.S. Cl.
CPC ............... *H02J 7/041* (2013.01); *H02J 7/0057* (2013.01); *G01R 31/3679* (2013.01)

(58) Field of Classification Search
CPC ..... H02J 7/041; H02J 7/0057; G01R 31/3679
USPC ................................. 320/134, 107
See application file for complete search history.

(56) References Cited

U.S. PATENT DOCUMENTS

| | | | |
|---|---|---|---|
| 5,631,533 A * | 5/1997 | Imaseki | 320/118 |
| 5,684,404 A | 11/1997 | Millar | |
| 2006/0261816 A1 | 11/2006 | Rocher et al. | |
| 2011/0029265 A1 | 2/2011 | Martens | |
| 2013/0158915 A1 | 6/2013 | Humla | |

FOREIGN PATENT DOCUMENTS

| | | |
|---|---|---|
| DE | 4316471 A1 | 11/1994 |
| WO | 2009093999 A1 | 7/2009 |
| WO | 2011041029 A1 | 4/2011 |

* cited by examiner

*Primary Examiner* — Jack Chiang
*Assistant Examiner* — Brandon Bowers
(74) *Attorney, Agent, or Firm* — Isidore PLLC

(57) ABSTRACT

A computer-implemented method and information handling system manage a rate of decreasing full capacity of a rechargeable battery by using a projected/target rate of decreasing charge capacity for the battery. The method includes determining an actual rate of decreasing charge capacity of the battery, comparing the actual rate of decreasing charge capacity to the projected/target rate of decreasing charge capacity to determine whether the actual rate of decreasing charge capacity is greater than the projected rate of decreasing charge capacity, and if the actual rate of decreasing charge capacity is greater than the projected/target rate of decreasing charge capacity, modifying one or more variable parameters to slow down the actual rate of decreasing charge capacity of the battery such that the actual rate of decreasing charge capacity remains within a range of the projected/target rate of decreasing charge capacity, and charging and discharging the battery using the modified parameters.

19 Claims, 5 Drawing Sheets

MITIGATING PREMATURE WEAR OUT OF A RECHARGEABLE BATTERY

BACKGROUND

1. Technical Field

The present disclosure relates generally to rechargeable batteries in information handling systems and more particularly to a method and system for mitigating premature wear out of a rechargeable battery.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include portable devices such as notebook computers, MP3 players, personal data assistants (PDAs), digital cameras, cellular phones, cordless phones, tablet computers or any device a user may carry for use from one location to another and which includes a processor for processing data. These portable devices are typically powered by a rechargeable battery.

In general, charging capacity of rechargeable batteries decreases with repeated charges and discharges. Hence, the duration of a rechargeable battery from an effective full charge to an effective full drain will gradually decrease over time until the battery's end of life is reached. Once the battery's end of life is reached, the battery has to be replaced.

Presently, early battery replacements have been a common user complaint. To quell such complaints, projected end of life of rechargeable batteries is being provided. Since the projected end of life of the batteries is provided, it is necessary that the batteries last as long as or nearly as long as projected, lest users continue to complain of early battery replacements.

BRIEF SUMMARY

A computer-implemented method, an information handling system, and a computer readable device having executable program code are provided for by reducing a rate of decrease in remaining full charge capacity for a rechargeable battery when the rate of decrease exceeds a projected rate for the rechargeable battery. The resulting reduction in the rate of decrease enables the end of life of the battery to remain within a range of the projected end of life of the battery.

The computer-implemented method includes determining an actual rate of decreasing charge capacity of the battery, comparing the actual rate of decreasing charge capacity to a projected rate of decreasing charge capacity to determine whether the actual rate of decreasing charge capacity is greater than the projected rate of decreasing charge capacity, and if the actual rate of decreasing charge capacity is greater than the projected rate of decreasing charge capacity, modifying one or more variable parameters to slow down the actual rate of decreasing charge capacity of the battery such that the actual rate of decreasing charge capacity remains within a range of the projected rate of decreasing charge capacity with each repeated charge and discharge. The computer implemented method further includes charging and discharging the rechargeable battery using the modified values of the one or more variable parameters.

In one aspect, the computer-implemented method modifies the one or more variable parameters by determining whether the actual rate of decreasing charge capacity is greater than the projected rate of decreasing charge capacity due to one or more of voltage induced stress, charging current induced stress, discharging current induced stress, or temperature induced stress. In one embodiment, the computer-implemented method then includes reducing a termination voltage used when charging the rechargeable battery in order to decrease the voltage induced stress on the battery when the actual rate of decreasing charge capacity is greater than the projected rate of decreasing charge capacity due to voltage induced stress. In another embodiment, the computer-implemented method also includes reducing a charge current or fast charge rate used to charge the rechargeable battery in order to decrease the current induced stress on the battery caused by the charging current. Also, in another embodiment, the computer-implemented method includes reducing the discharge current or rate of current discharge when the actual rate of decreasing charge capacity is greater than the projected rate of decreasing charge capacity due to current induced stress caused by the discharging current or rate of current discharge.

In one aspect, in order to further decrease the current induced stress when the increased rate of decreasing charge capacity is because of charging current induced stress, the computer-implemented method also reduces a termination voltage used to charge the rechargeable battery. In another aspect, to further decrease the current induced stress when the increased rate of decreasing charge capacity is because of discharging current induced stress, the computer-implemented method also includes reducing a processor maximum operating frequency to decrease the current induced stress on the battery.

In one aspect, the computer-implemented method includes reducing a current fast charge and a termination voltage used to charge the rechargeable battery in order to decrease the temperature induced stress on the battery when the actual rate of decreasing charge capacity is greater than the projected rate of decreasing charge capacity due to temperature induced stress.

In one embodiment, the computer-implemented method further includes modifying cooling system settings to use higher fan speeds to further decrease the temperature induced stress on the battery. In another embodiment, the computer-implemented method includes modifying system power management settings to modulate processor frequencies to further decrease the temperature induced stress on the battery.

According to one aspect, the computer-implemented method includes determining an actual rate of decreasing charge capacity of the battery by periodically collecting battery usage data, including system operating data that affects a charge capacity of the battery, and sending the collected battery usage data to a remote computer system for analysis to determine conditions that prematurely age the rechargeable battery.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
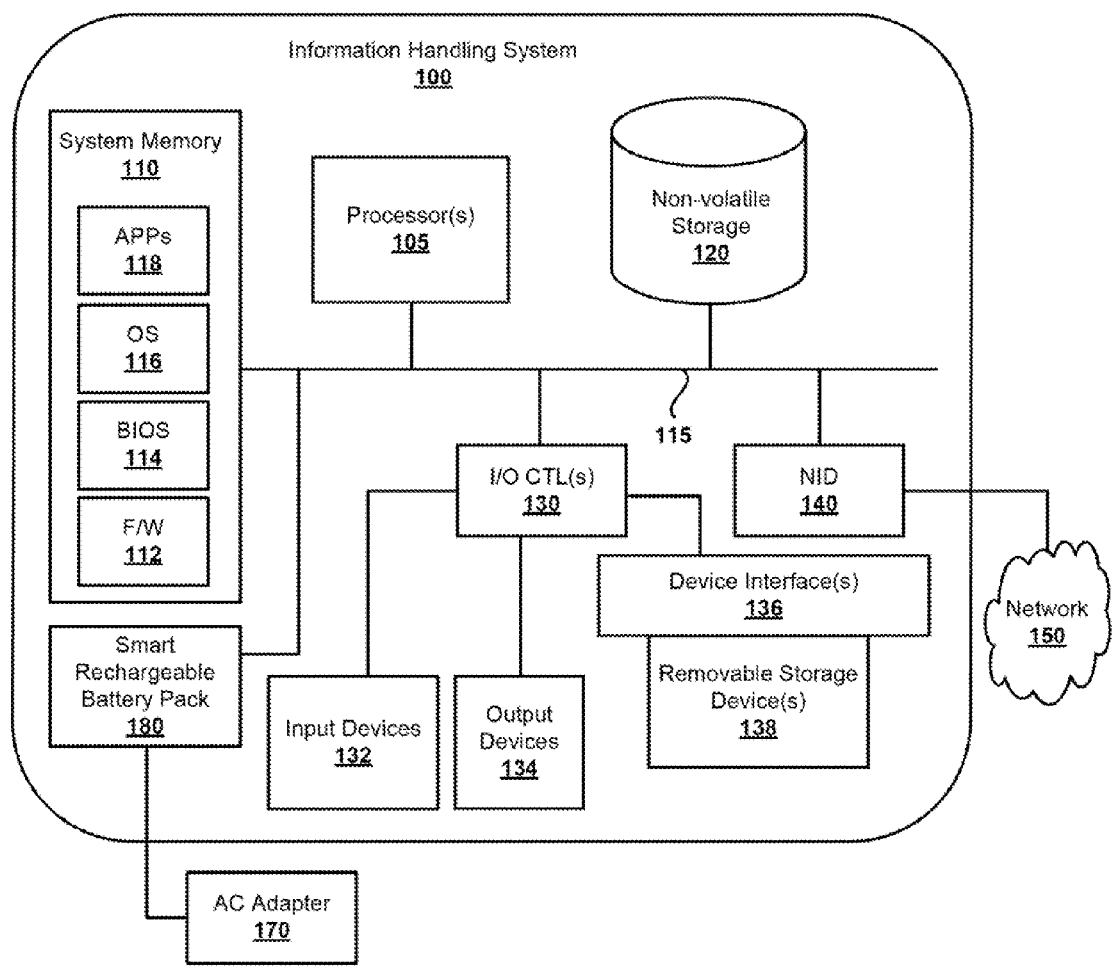
FIG. 1 illustrates a block diagram representation of an exemplary information handling system having a smart rechargeable battery pack and within which aspects of the disclosure can advantageously be implemented.

The illustrative embodiments provide an information handling system with a smart rechargeable battery pack. The smart rechargeable battery pack has a battery management unit (BMU) that periodically checks a rechargeable battery against projected aging profiles to determine whether or not the battery is aging faster than projected. If the battery is aging faster than the projected normal rate of aging, then the BMU takes corrective actions to slow down the battery's aging process. In another embodiment, the BMU periodically checks the rechargeable battery against a target aging profile, established by the user of the device. The BMU takes a first set of corrective actions when the battery is aging faster than the target age of life, and the BMU takes a second set of corrective actions when the battery is again significantly slower than the target age of life. According to one aspect, the BMU monitors specific conditions associated with battery operating and/or usage characteristics that can affect the remaining full charge capacity of the battery, and the BMU modifies one or more of variable parameters to ensure that a rechargeable battery lasts as long as a projected end of life of the battery and/or a target end of life of the battery.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

With reference now to the figures wherein like reference numbers denote like parts, FIG. 1 illustrates a block diagram representation of an exemplary information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, a personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, exemplary IHS 100 includes one or more processor(s) 105 coupled to a system memory 110 via system interconnect 115. System interconnect 115 can be interchangeably referred to as a system bus in one or more embodiments. System memory 110 can include therein a plurality of software and/or firmware modules including firmware (F/W) 112, basic input/output system (BIOS) 114, operating system (OS) 116, and application(s) 118. The one or more software and/or firmware modules within system memory 110 can be loaded into processor(s) 105 during operation of IHS 100.

Some IHS 100 may further include one or more input/output (I/O) controllers 130 which support connection by, and processing of, signals from one or more connected input device(s) 132, such as a keyboard, mouse, touch screen, or microphone. I/O controllers 130 also support connection to and forwarding of output signals to one or more connected output devices 134, such as a monitor or display device, a camera, a microphone, or audio speaker(s) (not shown). Additionally, in one or more embodiments, one or more device interfaces 136, such as an optical reader, a universal serial bus (USB), a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removable storage device(s) 138, such as a compact disk (CD), digital video disk (DVD), flash drive, or flash memory card. Device interfaces 136 can further include general purpose I/O interfaces such as $I^2C$, SMBus, and peripheral component interconnect (PCI) buses.

In addition, IHS 100 may comprise a network interface device (NID) 140. NID 140 enables IHS 100 to communicate and/or interface with other devices, services, and components that are located externally to IHS 100. These devices, services, and components can interface with IHS 100 via an external network, such as exemplary network 150, using one or more communication protocols. Network 150 can be a local area network, wide area network, personal area network, and the like, and the connection to and/or between network 150 and IHS 100 can be wired or wireless or a combination thereof. For purposes of discussion, network 150 is indicated as a single collective component for simplicity. However, it is appreciated that network 150 can comprise one or more direct connections to other devices as well as a more complex set of interconnections as can exist within a wide area network, such as the Internet.

IHS 100 is powered by smart rechargeable battery pack 180. Smart rechargeable battery pack 180 can be connected to processor(s) 105 via the system interconnect 115. Smart rechargeable battery pack 180 may also be connected to an external power source (not shown) via alternating current (AC) adapter 170. It will be understood that external power may be alternatively provided by any other suitable external source (e.g., external DC power source) or that AC adapter 170 may alternatively be integrated within IHS 100 such that external power may be supplied directly to IHS 100. As shown, AC adapter 170 is removably coupled to, and separable from, smart rechargeable battery pack 180.

Figure 2:
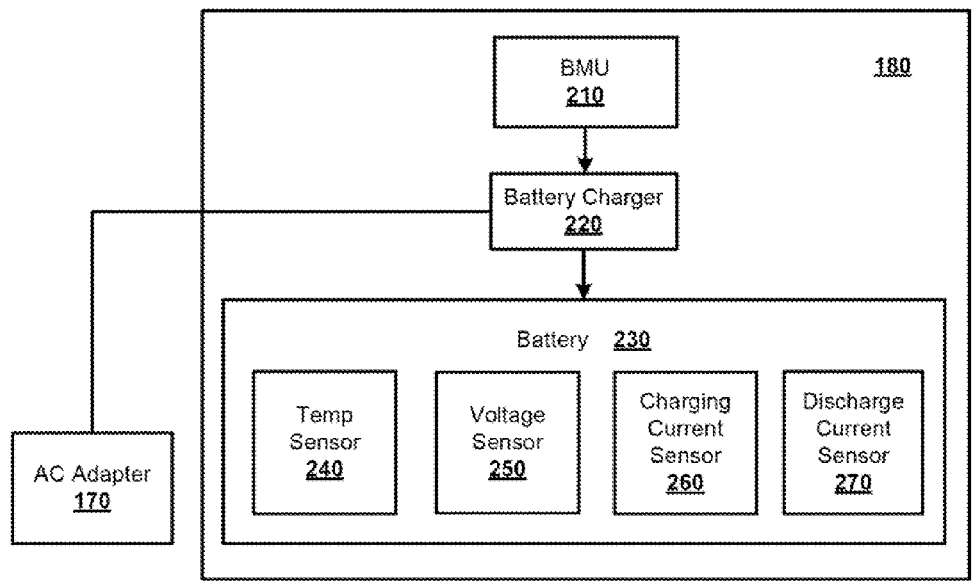
FIG. 2 depicts an exemplary smart rechargeable battery pack with components designed to support certain of the disclosed aspects, according to one embodiment.

FIG. 2 depicts an exemplary smart rechargeable battery pack 180. The exemplary smart rechargeable battery pack 180 includes a battery management unit (BMU) 210 connected to a battery charger 220 and a rechargeable battery 230. The rechargeable battery 230 may include one or more rechargeable cells (not shown). The rechargeable battery 230 may also include a temperature sensor 240, a voltage sensor 250, a charging current sensor 260, and a discharge current sensor 270. The temperature sensor 240, voltage sensor 250, current sensor 260 and discharge current sensor 270 are used to respectively provide to the BMU 210 the temperature of the battery, the voltage in the battery, and the current going through the battery during charging and discharging. As described further, the temperature sensor 240 detects both high and low temperature conditions that can affect the battery life. When AC adapter 170 is connected to an AC outlet (not shown), the battery charger 220 charges the rechargeable battery 230 as directed by the BMU 210.

Figure 3:
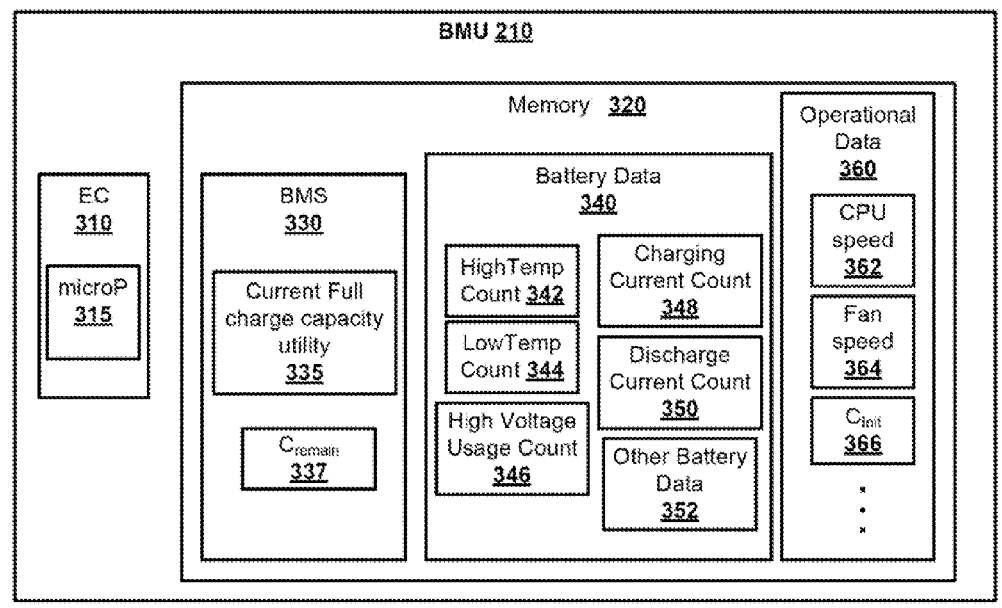
FIG. 3 depicts a battery management unit (BMU) configured with hardware and firmware that enables tracking of battery data and system operational data, according to one embodiment.

FIG. 3 depicts the BMU 210 in greater detail. The BMU 210 includes an embedded controller (EC) 310 and a memory 320. The EC 310 includes a microprocessor 315 and performs the measurement of current and voltage and the calculation of current capacity of the battery.

Figure 4:
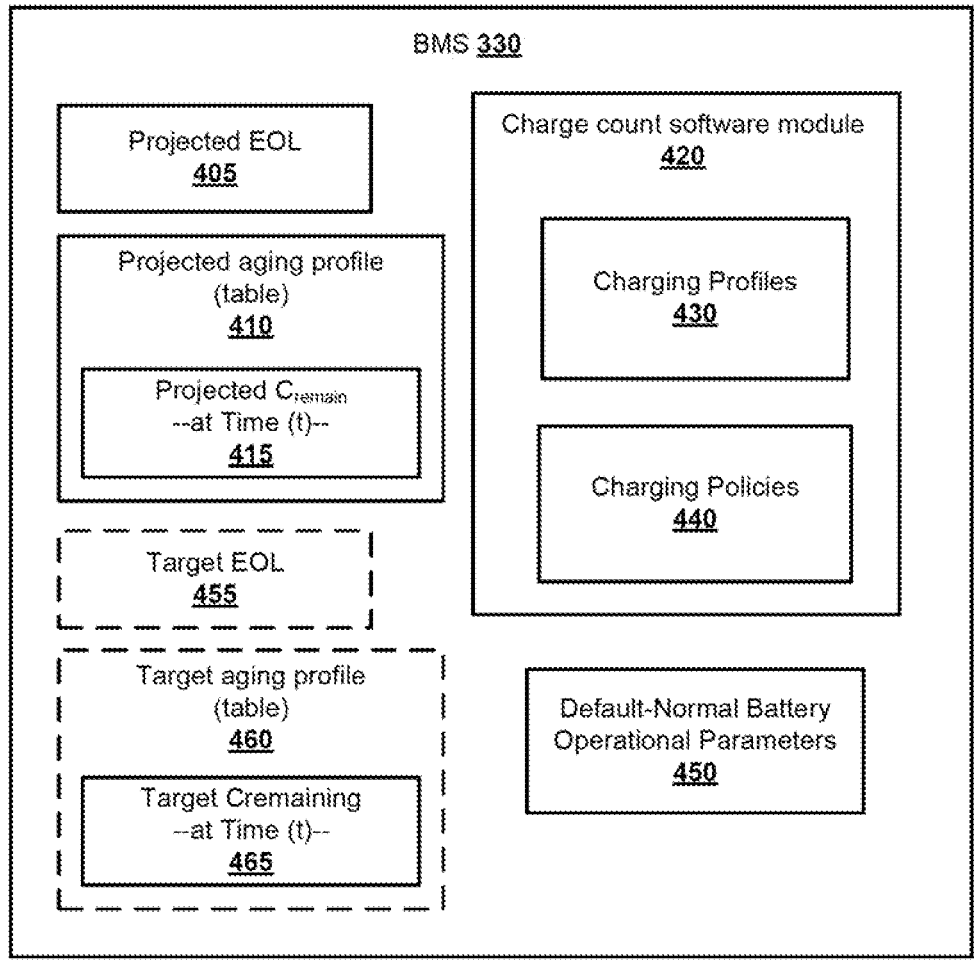
FIG. 4 depicts software and/or data modules of a battery management system, utilized within one or more of the disclosed embodiments.

In one embodiment, the EC 310 also performs the periodic comparison of current $C_{remain}$ 337 to projected $C_{remain}$ from projected aging profile table 410 (FIG. 4). However, in one or more alternate embodiments, the periodic comparison can be completed by any one of the embedded controller microprocessor 315, or some other system management processors (not shown), or the main system processor 105 (FIG. 1).

Memory 320 is used to store an executable battery management system (BMS) 330, battery data 340, and operational data 360. Executing and/or running on BMU 210 and specifically on the microprocessor 315 of EC 310 is a current full charge capacity value utility 335. According to the described embodiments, the current full charge capacity value utility 335 enables BMU 210 to algorithmically determine the current full charge capacity, $C_{remain}$ 337, of the battery 230. In the illustrated embodiment, BMS 330 includes current full charge capacity value utility 335 and maintains the most recently determined $C_{remain}$ 337. In an alternate embodiment, current full charge capacity value utility 335 can be a separate executable module within memory 320. As shown by FIG. 4, BMS 330 also includes projected aging profile table 410, which includes time-correlated projections of full charge remaining (referred to herein as projected $C_{remain}$ 415) at specific times in the predicted/projected lifespan of the battery 230. These projections are based on expected normal operation of the device being powered by the battery 230 and expected normal charging and discharging conditions. When current full charge capacity utility 335 is executed on microprocessor 315, current full charge capacity utility 335 generates a current value of $C_{remain}$ 337, which correlates to the actual life remaining of the battery 230. This calculated value is then compared to the projected value, as provided herein.

The EC 310 uses the executable code of BMS 330 along with battery data 340 and operational data 360 to control the manner in which the battery charger 220 charges the rechargeable battery 230. According to one embodiment, the battery data 340 and/or the operational data 360 includes battery usage data, such as charging and discharging data, environmental data, processor operating speed data, system power management and cooling system settings, and other data that can collectively affect one or more of the battery's full charge capacity, discharge characteristics, and rate of decline of the battery's full charge capacity (i.e., data that can contribute to the battery's actual end of life).

As further shown by FIG. 3, battery data 340 comprises a plurality of data structures holding specific data. This data includes, but is not limited to, high temperature count 342 and low temperature count 344, high voltage usage count 346, charging current count 348, discharge current count 350, and other battery data 352. The measured low and high temperature, high voltage usage, and high charge and discharge currents recorded or detected by corresponding sensors 240, 250, 260 and 270 are periodically logged into the respective data structures representing the accumulated data (342-352). In one embodiment, which corresponds to the illustration of FIG. 3, the data structures include a counter for each variable parameter that is being tracked and which can affect the battery life. In one embodiment, battery data 340 can include current full charge battery capacity data (also referred to herein as C remaining or $C_{remain}$) 337 that is determined or calculated by BMU execution of current full charge capacity value utility 335. As will be explained further below, the BMU 210 may also periodically collect operational data 360 of the system. The operational data 360 is also stored in the memory 320. The operational data 360 can include processor speed 362, cooling fan speed 364, and a wide range of other operational data that also can affect the life of the battery 230 or can be utilized to determine what corrective measures can be taken by the BMU when the calculated $C_{remain}$ 337 and projected $C_{remain}$ 415 (FIG. 4) do not match.

Those of ordinary skill in the art will appreciate that the hardware components and basic configuration depicted in FIGS. 1-3 described herein may vary. Thus, the illustrative components within IHS 100 are not intended to be exhaustive, but rather are representative to highlight components that can be utilized to implement aspects of the present disclosure. For example, other devices/components may be used in addition to or in place of the hardware depicted. The depicted example does not convey or imply any architectural or other limitations with respect to the presently described embodiments and/or the general disclosure.

FIG. 4 depicts the BMS 330 in more detail. The BMS 330 includes projected end of life (EOL) 405, projected aging profile table 410, and a charge count software module 420 that incorporates charging profiles 430 and charging policies 440. The charging profiles 430 include parameters that may be used for charging the rechargeable battery 230. The charging policies 440 delineate when best to charge the battery 230. The projected aging profile table 410 includes a time-based (and probably chronological) mapping of projected rates of decreasing full charge capacity for the battery 230. The EC 310 uses the charging profiles 430 and charging policies 440 to control charges into the rechargeable battery 230 to ensure that those aspects of the charging of the battery that can affect the battery's rate of decreasing charge capacity and which are controllable by the charging profiles and policies, are set to ensure that the battery's actual rate of decreasing capacity mirrors or approaches, as best as possible, the projected rates of decreasing charge capacity in the projected aging profiles 410.

For instance, most systems charge a battery using a constant current fast charge followed by a constant termination voltage (i.e., "top off voltage") where the desired final battery voltage is applied and the current is allowed to taper off until a low current threshold is reached. According to at least one embodiment, the BMU 210 manages gradual changes in one or both of the termination voltage and the fast charge current in order for the battery 230 to exhibit or have a life span and specifically a rate of declining full charge capacity that approaches the values provided by or in the projected aging profiles 410. In one or more embodiments, the BMU 210 may also adjust system power management and/or cooling system settings to reduce stresses that may detrimentally affect the battery 230. Thus, if the battery 230 is intended (or projected) to last three years with an end of life at three years of thirty percent (30%) of original capacity, the BMU 210 will ensure that at three years, the actual capacity of the battery 230 is at or close to 30% of the original capacity.

To do so, the BMU 210 checks the battery 230 periodically against the projected aging profile 410. If the BMU 210 determines that the battery 230 is aging at the rate or slower than the rate in the projected aging profiles 410, the BMU 210 will continue to have the battery 230 charged using current charging parameters. If, on the other hand, the BMU 210 determines that the battery 230 is aging at a rate faster than the rate in the projected aging profiles 410, then the BMU 210 will adjust one or more of (a) the charging parameters, (b) the charging policies and (c) the operational settings of the device. The BMU 210 implements specific adjustments so that the actual life of the battery can continue to track as best as possible the projected life of the battery.

As another example, if the battery 230 is projected to have a reduced full charge capacity of 70% of the original full charge capacity at the end of 18 months, the BMU 210 ensures that at 18 months, the reduced full charge capacity is close to the 70% projected. With this latter example, the BMU 210 is configured to and actually (a) monitors and records the battery capacity at different intervals, (b) monitors and records, over an ongoing period, conditions that can affect (i.e., escalate) the rate of decreasing battery capacity, (c) compares the detected battery capacity at the 18 month timeframe with the projected full capacity expected from the aging profiles, and (d) in response to the comparison indicating the battery exhibiting a lower actual charging capacity (e.g., at 50%) than the projected 18 month full charge capacity (of 70%) within the aging profiles, modifies one or more variable parameters to change the rate of declining battery life. The modified parameters are then utilized to charge and discharge the battery, as well as moderate other aspects of the system's operating conditions, such as maximum processing speed, system cooling settings, and others. The modification made by the BMU 210 at the 18 month check would then affect the future rate of aging of the battery, such that the rate of aging decreases. Thus, at 19 months, the battery should exhibit a full charge capacity that is proportionally closer to the projected 19 month full charge capacity than the actual 18 month full charge capacity was relative to the 18 month projected full charge capacity. The periodicity of the comparisons and adjustments can be variable and based on how close or far away from the projected aging profile the actual recorded battery aging data is.

According to one or more embodiments, the projected aging profile table 410 includes at least one table in which projected remaining battery capacity, (i.e., projected $C_{remain}$), expressed as a percentage of the original battery capacity, is correlated to one or more of: (1) cycle count e.g., number of times the battery has gone through a charge/discharge process, (2) calendar life (in months) of the battery, and/or (3) number of times the battery has been at or above a particular operating condition threshold. As an example, the operating condition threshold can be a threshold voltage. In a particular embodiment, the particular threshold voltage may be 4.1V per cell in the battery, for example. As other examples, the operating condition threshold can be a charging current threshold or a discharging current threshold. In yet other examples, the operating condition threshold can be a high and/or low temperature threshold.

In order to make the determinations of which conditions are at or above or below the respective thresholds, BMS 330 also includes a data structure 450 containing respective default or normal operating parameters and or parameter values for each operating condition threshold. Thus, for example, normal operational parameter data structure 450 can provide a discharge current range for normal operations of the device, and the threshold includes a high discharge current range for device operation that is less than the maximum discharge current at which the device can be operated (e.g., when the processor is performing lots of data processing or when a large number of applications are concurrently executing on the processor).

A set of three representative tables are provided below. The tables are presented side by side, and are illustrative of the projected aging profiles of the battery 230 using three of the above referenced five age tracking parameters.

| Projected $C_{remain}$ (%) | Cycle Count | Projected $C_{remain}$ (%) | Calendar Age (months) | Projected $C_{remain}$ (%) | Time @ or above Threshold Voltage (hours) |
|---|---|---|---|---|---|
| 99.99 | 1 | 100 | 1 | 99.999 | 1 |
| 99.95 | 2 | 99.999 | 2 | 99.998 | 2 |
| . | . | . | . | . | . |
| . | . | . | . | . | . |
| . | . | . | . | . | . |
| 85.5 | 250 | 85.5 | 9 | 85.5 | 60 |
| . | . | . | . | . | . |
| . | . | . | . | . | . |
| . | . | . | . | . | . |
| Cycle Count Projected Aging Profile Table | | Calendar Age Projected Aging Profile Table | | Time @ or above Threshold Voltage Aging Profile Table | |

According to one embodiment, at first AC plug event of each day, the BMU 210 calculates a percentage of remaining battery capacity (which is the amount of electrical energy stored in the battery) by dividing present battery full charge capacity stored in the battery data 340 by initial battery full charge capacity ($C_{init}$) 366 stored in operational data 360. The BMU 210 compares this resulting value, which will be referred to as actual $C_{remain}$, to model projections in the tables above. Thus, the BMU 210 will compare actual $C_{remain}$ to the projected $C_{remain}$ in: (1) the cycle count table, (2) the calendar life table, and (3) the time at or above threshold voltage table. If the actual $C_{remain}$ is less than at least one projected $C_{remain}$ by a preset percentage value (e.g., two percent (2%) in one embodiment), then the actual battery wear out rate may be interpreted as exceeding the projected battery wear out rate. In such cases, the BMU 210 will take corrective actions to slow down the actual wear out rate of the battery.

For example, the actual cycle count is correlated to a projected $C_{remain}$ in the cycle count projected aging profile table above. If the actual $C_{remain}$ is less than the projected $C_{remain}$ for that actual cycle count by the preset percentage value, then the battery 230 is wearing out faster than projected. Likewise, in another example, if the actual $C_{remain}$ is less than the projected $C_{remain}$ at the actual calendar life of the battery and/or at the actual time at or above threshold voltage by the preset percentage value, then the battery is wearing out faster than projected.

According to one aspect of the embodiment, the battery can be wearing out faster than projected due to induced stresses. The induced stresses may include, but are not limited to, voltage, current and temperature stresses. If the battery is wearing out faster than projected due to voltage induced stress on the battery, then terminal charge voltage should be reduced to slow down the rate at which the voltage induced stress is wearing out the battery. Thus, the BMU 210 will: (1) reduce the top off voltage (unless the top off voltage is already at a minimum value); (2) increment an adjustment counter ($C_{adj}$) by one (i.e., $C_{adj}+1$, where $0<=C_{adj}<\infty$), and (3) reduce successive calculated $C_{remain}$ by $C_{adj}$ (i.e., calculated $C_{remain}-C_{adj}$). According to one embodiment, the minimum value represents a determinable voltage above which the battery can continue to charge to its currently available full capacity. Adjusting the calculated $C_{remain}$ by $C_{adj}$ ensures that each top off voltage adjustment reduces the calculated full charge capacity by a preset percentage (e.g., one percent (1%)). In a particular embodiment, the BMU 210 will reduce the top off voltage by 10 mV each time it is found that voltage induced stress is wearing out the battery 230 faster than projected.

If the battery is wearing out faster than projected due to current induced stress, the BMU 210 may: (1) reduce the peak charge current as well as the top off voltage, and (2) in some instances, adjust system power management settings. For example, in some embodiments the BMU 210 may reduce the charge current by a preselected percentage (e.g., one percent (1%)) and the top off voltage by a preselected or dynamically calculated voltage (e.g., 10 mV). In addition, when the charge of the battery 230 goes below a certain value (e.g., 20% of full capacity) during operation, the BMU 210 may adjust system power management settings to reduce maximum processor operating voltage and frequency in order to further reduce induced current stress on the battery 230. Note that in the case where the top off voltage is reduced due to induced current stress, no adjustments need be made to future calculated $C_{remain}$.

According to one or more embodiments, if the battery is wearing out faster than projected due to temperature induced stress, then the BMU 210 may combine the induced voltage stress and current stress corrective actions outlined above to reduce the temperature induced stress. Further, the BMU 210 may adjust system cooling settings such that more aggressive or higher fan speeds are used to cool the system down. Alternatively, or in addition to using more aggressive or higher fan speeds, the BMU 210 may adjust system power management settings to reduce maximum processor operating speed or to eliminate altogether maximum processor operating speed for a given temperature in order to further lower dissipated power.

In cases where there is a plurality of stresses wearing out the battery 230, one embodiment establishes that the predominant stress is taken into consideration when formulating a corrective action. If there is not a predominant stress but rather two or more stresses are equally wearing out the battery 230, then a combination of corrective actions may be used. The BMU 210 will then use the formulated corrective action to modify charge parameters in the charging profiles stored in the memory 320.

For example, in the case of voltage induced stress, the charge parameters may be modified by lowering the top off voltage by a certain value, which in some embodiments may be 10 mV. In the case of current induced stress, the charge parameters may be modified by lowering both the fast charge current and the top off voltage. In some embodiments, the fast charge current may be lowered by one percent (1%) and the top off voltage by 10 mV. Just as in the case of the current induced stress, in the case of temperature induced stress, the charging parameters may be modified by lowering both the fast charge current and the top off voltage.

To determine which one of the voltage, current and temperature induced stresses is predominantly wearing out the battery, accumulated voltage, current, and temperature stresses are compared to each other. Tracking accumulated voltage and current stresses can be as simple as recording a number of times the battery 230 has been above a particular threshold voltage value and a threshold current value, respectively, over the life of the battery. It is well known that both a cold and a warm storage environment may detrimentally affect a rechargeable battery. Thus, the accumulated temperature stress may include tracking and/or recording a number of times the temperature of the battery has been above a first threshold temperature value and/or a number of times the battery has been below a second threshold temperature value over the life of the battery. Also, in one embodiment, detection of excessive wear out due to cold temperature can be mediated by one or more of: (a) not allowing the system to run on battery if the surrounding environment is too cold; or (b) not allowing the battery to charge, if the temperature is too cold, reducing fan speed, and/or increasing processor speed, among other possible system-level operational adjustments. In these implementations, the stress with the greater numerical value is the predominant wear out stress.

To accomplish the task set out above, the BMU 210 may periodically collect and store in battery data 340 information about present battery temperature, present current going through or generated by the battery 230 and present voltage in the battery 230. Using the present current and voltage, the BMU 210 may determine whether a threshold current and voltage are exceeded by their respective preset values. Further, the BMU 210 may also determine whether the temperature is more or less than the first or the second threshold value, respectively.

Information regarding whether or not the present current and voltage exceed a threshold value as well as whether the present temperature is more or less than a first or a second threshold value, respectively, may all be stored in tables in the operational data 360. The BMU 210 may also maintain in the operational data 360 information related to the initial full charge capacity of the battery 230, a charge/discharge cycle count over the life of the battery 230, calendar life of the battery 230 and a number of times the battery has been at or above a particular threshold voltage, among other types of operational data.

Data in both the battery data 340 and the operational data 360 may periodically be sent to processor(s) 105 for analysis. Alternatively or in addition to sending the data to processors(s) 105, the data may be sent, via network 150 (see FIG. 1), to a central server and/or to an information technology (IT) personnel for analysis. The analysis may reveal conditions that may cause rechargeable batteries in general, and battery 230, in particular, to age prematurely. Upon analysis, the central server or the IT personnel may provide control instructions to the IHS 100 to mitigate factors that causing premature aging.

In one or more embodiments, as provided within FIG. 4, BMS 330 can also include a user-provided target end of life (EOL) 455 and associated target EOL aging profile 460. The target EOL aging profile 460 is different from the projected aging profile 410, as it is specifically established by the user, and can be established independent of any knowledge of the battery's projected EOL 405. In one example, using a system having a battery with projected EOL of two (2) years, a first user or customer may want to operate aggressively and provide a target EOL of one (1) year, while a second user of a similarly configured system and battery, may desire a target EOL of three (3) years, and be willing to sacrifice performance to achieve that EOL target for the battery. In both of these scenarios, the BMU 210 would actually compare the current aging of the battery against a target $C_{remain}$ 465 within the pre-set target aging profile 460, established by the user of the device, rather than a $C_{remain}$ value from the projected aging profile 410. Then, the BMU 210 takes a first set of corrective actions when the battery is aging faster than the target $C_{remain}$ 465, and the BMU 210 takes a second set of corrective actions when the battery is aging significantly slower than represented by the target $C_{remain}$ 465. Thus, the entire functional description herein, which references and utilizes the projected EOL 405 and projected aging profile 410 can be implemented using the target EOL 455 provided by user entry and corresponding target aging profile 460, in one or more alternate embodiments.

In one embodiment, the target aging profile(s) 460 can be derived by the BMU 210 and or other processor of the system based on an extrapolation involving the target EOL 455 and the current battery full charge capacity. In another embodiment, a select subset of available target EOLs can be presented to the user (via a user interface for example) for user selection. Once the user selects a specific one of the available target EOLs, one or more pre-computed, associated target aging profiles (which is pre-determined for the battery) of the selected target EOL is then automatically applied and stored within the BMU 210 to complete the later comparisons. Also, for the situations where the battery wear out is slower than is allowed for or permitted with the specific target aging profile being utilized, the BMU 210 can autonomously modify the operational characteristics of the device, e.g., by increasing the processor speed, increasing the fan speeds, improving the display resolution, etc. Notably, this aspect of the disclosure can also be applied to the use of the projected aging profiles 410.

Figure 5:
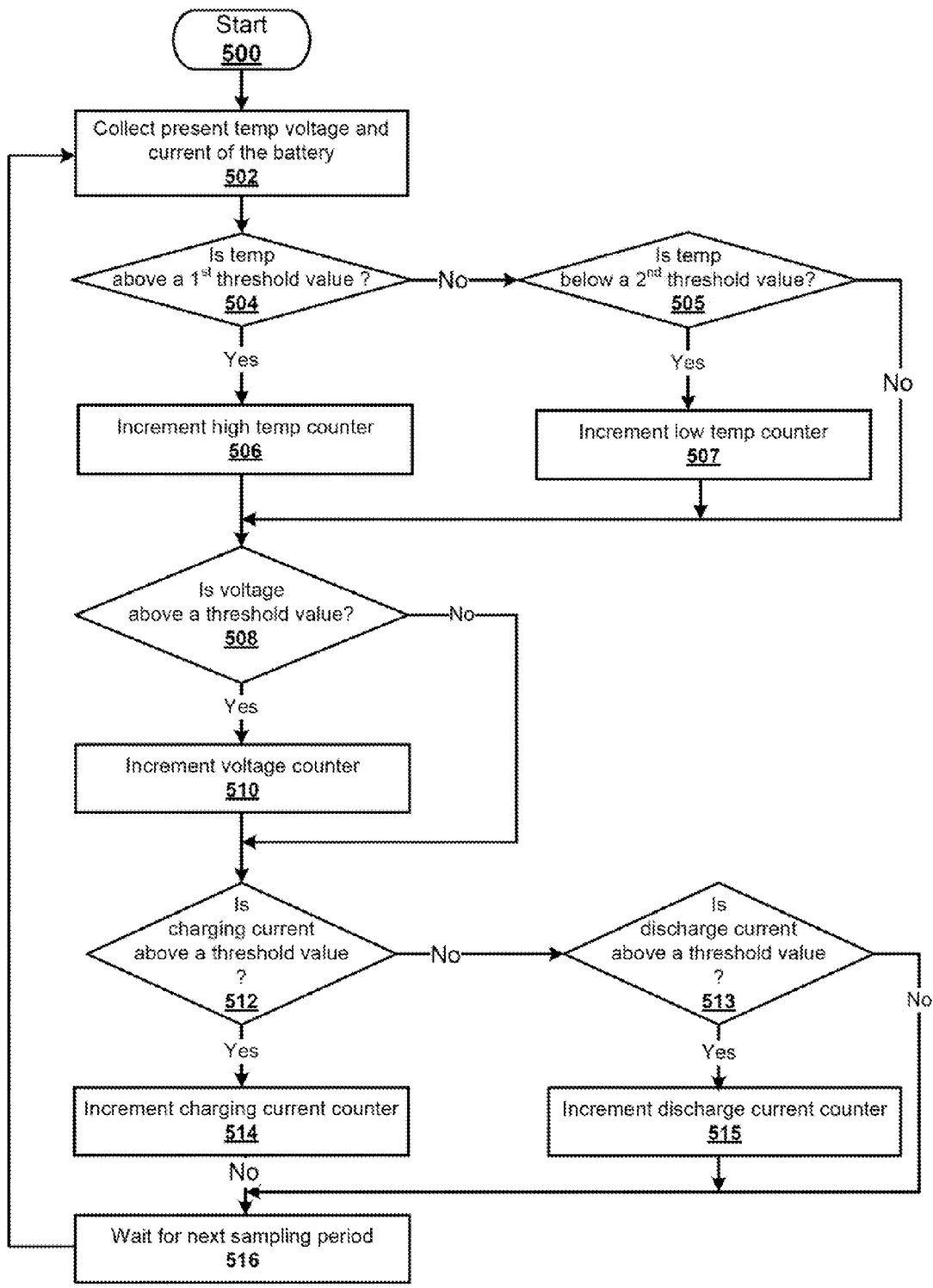
FIG. 5 is a flowchart of a process that can be used by the BMU to collect information about present state of a rechargeable battery, according to one embodiment.

FIG. 5 is a flowchart of a method process that may be used by the BMU 210 to collect information about present state of the battery 230. The process starts whenever the smart battery pack 180 contains a threshold amount of starting voltage (block 500). Upon starting, the BMU 210 obtains from sensors 240, 250, 260 and 270 the temperature of the battery 230 or ambient temperature surrounding the battery, the amount of current that is going through the battery 230, and the voltage of the battery 230, (block 502). Then the BMU 210 determines whether or not the temperature of the battery 230 is above a first temperature threshold value (decision block 504), below a second temperature threshold value (decision block 505), whether the voltage exceeds a voltage threshold value (decision block 508), whether the charging current exceeds a charging current threshold value (decision block 512), and whether the discharging current exceeds a discharging current threshold value (decision block 513). If the temperature of the battery 230 is within the two temperature threshold values and the voltage and current threshold values are not exceeded, the process ends (block 516). Otherwise, if the temperature of the battery 230 is above the first temperature threshold value, a high temperature counter (342) is incremented (block 506). If the temperature of the battery 230 is below the second temperature threshold value, a low temperature counter (344) is incremented (block 507). If the voltage is above the voltage threshold value, a voltage counter (346) is incremented (block 510). Also, if the charging current is above the charging current threshold value, a charging current counter (348) is incremented (block 514), and if the discharging current is above the discharging current threshold value, a discharging current counter (350) is incremented (block 515). The process moves to block 516 at which the BMU waits until a next sampling period to initiate the same sequence of sensor data retrieval and counter updates based on detected or senses operational characteristics of the device, which can affect the battery life. The process will repeat on a periodic basis until the charge in the battery decreases to an end of life value, such as below the starting threshold voltage value, or the battery is replaced.

Generally, the above sampling of operational data provides a histogramming of operational data within acceptable control limits to determine what may be causing degradation if the actual full charge capacity is decreasing faster than the projected or target full charge capacity of the battery 230. According to one embodiment, in addition to tracking the numerical value of the number of times the specific operating characteristic exceeds a particular threshold value, the BMU 210 can also track the amount by which the operating characteristic exceeds the threshold. Thus, for example, a voltage that exceeds the voltage threshold value by 0.5V or more should be automatically tagged and signaled to the BMU 210 to provide additional weight to the high voltage condition than, for example, a voltage exceeding the voltage threshold value by 10 mV. Also, as another example, in one embodiment, the length of time a condition is tracked is an important consideration in ascertaining which conditions do in fact lead to the increased rate of change. Thus, a voltage that exceeds the voltage threshold value by 10 mV over a period of time greater than 60 seconds or more should be automatically tagged and signaled to the BMU 210 to provide additional weight to the high voltage condition than, for example, a voltage exceeding the voltage threshold value by 30 mV for only 3 seconds.

According to one embodiment, this aspect of tracking relative amounts by which the tracked parameter exceeds the base threshold can include providing multiple, incremental thresholds and incrementing the corresponding counter by 1, 2, 3, etc. for each successive threshold that is exceeded. Thus, as an example, voltage thresholds can be defined for voltage usage exceeding 75%, 80%, and 90% of battery capacity, with each successive threshold receiving a larger point total. Thus, exceeding the 75% voltage threshold would cause the counter to be incremented by a single point, while exceeding the 80% threshold increments the counter by two points, and exceeding the 90% threshold increments the counter by three points. These assigned points can be sequenced (1, 1, 1=3 points) or cumulative (1, 2, 3=6 points), for alternate embodiments. In another simple example, the weighting for measured or detected temperature around 40 degrees Celsius would be less (e.g., a +1 count) than the weighting (e.g., 3) for measured or detected temperature above 60 degrees Celsius. Adding scaling or resolution to one of the wear out tracking functions can depend on how dominant the particular function is and how sensitive the battery cells are to the trigger factor.

Figure 6:
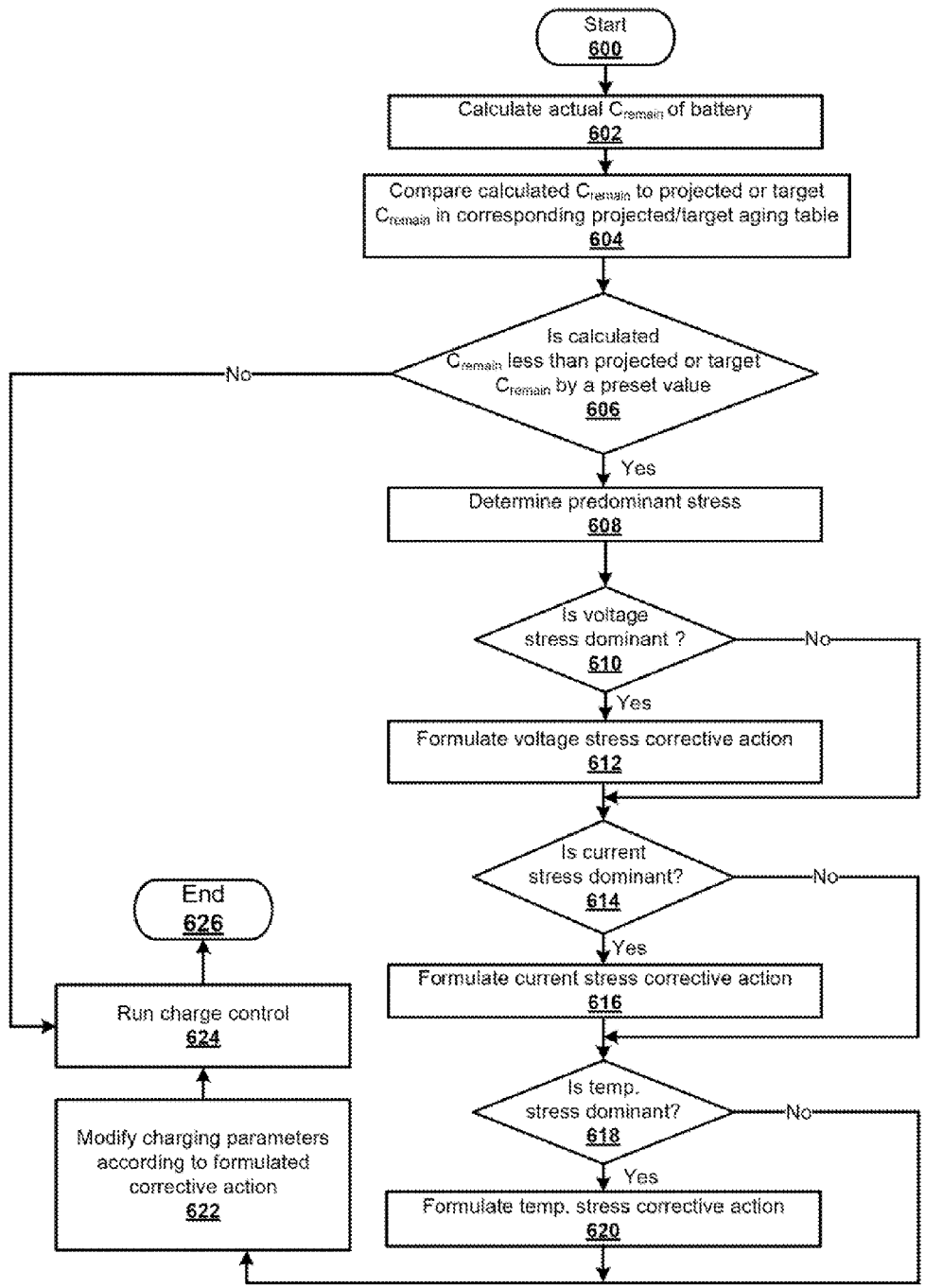
FIG. 6 is a flowchart of a method for reducing a rate of battery wear out caused by one or more monitored, variable parameters that can negatively affect the rate of battery wear out, according to one or more embodiments.

FIG. 6 is a flowchart of a process that may be used to mitigate and/or reduce the rate of aging and/or battery wear out based on specific battery data in order to allow the actual rate of aging to approach the projected rate of aging for the battery. The process specifically targets specific monitored and/or detectable conditions with corresponding variable parameters whose values can affect one or more of (a) the method of charging the battery and (b) a rate of declining full charge capacity of the battery. The illustrated process starts at first AC plug event of each day (start block 600), however other start times or triggers can be provided in alternate embodiments. Once started, the BMU 210 determines the present $C_{remain}$ of the battery 230 by dividing present battery full charge capacity by initial battery full charge capacity (block 602). As noted above, the BMU 210 keeps track of the cycle count of the battery 230, the calendar life of the battery 230 as well as the number of times the battery 230 has been at or above a particular threshold operating condition (e.g., threshold voltage). Using this information, the BMU 210 will determine at block 606 whether the actual wear out rate of the battery exceeds the projected wear out rate in the projected (or target) aging profiles. The BMU 210 does so by first comparing the actual $C_{remain}$ to the projected (or target) $C_{remain}$ corresponding to the current cycle count in the cycle count projected aging profile table, (block 604). This comparison is done to determine whether the projected (or target) $C_{remain}$ exceeds the actual $C_{remain}$ by a preset value. The preset value represents an acceptable delta or percentage by which the values of projected (or target) $C_{remain}$ and the actual $C_{remain}$ can be different without triggering any modification by BMU 210 of the device's operating parameters. If not, the process jumps to block 624 where the BMU 210 runs the control software module in order to instruct the battery charger 220 in the manner in which the rechargeable battery 230 is to be charged using the charging parameters. If, at decision block 606, the current $C_{remain}$ is lower than projected (or target) $C_{remain}$, then BMU determines which stress factors are dominant. In one or more embodiments, the determination is achieved by comparing the count values for each of the tracked wear out tracking stresses. Then, the stress having the largest count value is considered the dominant stressor on the battery with respect to its lifespan and/or its performance, and the control response would focus on reducing this specific stressor. Thus, if the stored counter value for voltage is larger than the other counter values, then voltage stress is dominant and control measures directed at reducing or eliminating voltage stress are implemented. The control measures implemented correlate to the charging parameter values, such that when the current $C_{remain}$ is lower than projected (or target) $C_{remain}$, the BMU modifies the charging parameters (block 622). The process then ends (blocks 626).

If the projected (or target) $C_{remain}$ exceeds the actual $C_{remain}$ by the preset value, then the BMU 210 will determine which one of induced voltage, current and temperature stresses is the predominant stress wearing out the battery (block 608). If the voltage is the predominant stress (as determined at decision block 610), the BMU 210 will formulate a corrective action as outlined in the voltage stress corrective action described herein (block 612). Otherwise, if the current is the predominant stress (as determined at decision block 614), the BMU 210 will formulate a corrective action as outlined in the current stress corrective action described herein (block 616). If the temperature is the predominant stress (as determined at decision block 618), the BMU 210 will formulate a corrective action as outlined in the temperature stress corrective action described herein (block 620). The BMU 210 will then modify the charging parameters in the charging profiles in accordance with the corrective action formulated (block 622). The BMU will then run the charge control software module in order for the battery 230 to be charged in accordance with the charging policies (block 624). The present iteration of the process then ends (block 626). It is appreciated that the above process is recursive in nature and can be implemented periodically throughout the life of the battery. The number of times and periodicity are design variables that can, in one embodiment, be based on empirical measurements, historical observations, laboratory testing, and/or calculations.

The processes disclosed above may be in the form of a computer program product accessible from a computer-usable or computer-readable medium providing program code for use by or in connection with a computer or any other instruction execution system. For the purposes of this description, a computer-usable or computer readable medium can be any tangible apparatus that can contain, store, communicate, propagate, or transport the program for use by or in connection with the instruction execution system or device.

The medium can be an electronic, magnetic, optical, electromagnetic, infrared, or semiconductor system or device or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) Digital Video/Versatile Disk (DVD) etc.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method of tracking and moderating a rate of battery wear out, the method comprising:
   determining an actual rate of decreasing charge capacity of a rechargeable battery that exhibits a decreasing full charge capacity;
   comparing the actual rate of decreasing charge capacity to a projected rate of decreasing charge capacity for the battery to determine whether the actual rate of decreasing charge capacity is greater than the projected rate of decreasing charge capacity; and
   if the actual rate of decreasing charge capacity is greater than the projected rate of decreasing charge capacity, modifying one or more variable parameters to slow down the actual rate of decreasing charge capacity of the battery such that the actual rate of decreasing charge capacity remains within a range of the projected rate of decreasing charge capacity, wherein: assigned values of the one or more variable parameters affect the rate of decreasing charge capacity; and modifying the one or more variable parameters includes changing a value of at least one variable parameter to provide updated parameter values and reducing a fast charge current and a termination voltage used to charge the rechargeable battery in order to decrease the temperature induced stress on the battery when the actual rate of decreasing charge capacity is greater than the projected rate of decreasing charge capacity due to temperature induced stress; and
   charging and discharging the battery utilizing the updated parameter values of the at least one variable parameter.

2. The computer-implemented method of claim 1, wherein modifying the one or more variable parameters includes determining whether the actual rate of decreasing charge capacity is greater than the projected rate of decreasing charge capacity due to at least one of voltage induced stress, charging current induced stress, discharging current induced stress, and temperature induced stress.

3. The computer-implemented method of claim 1, wherein modifying the one or more variable parameters includes reducing a termination voltage used when charging the rechargeable battery in order to decrease the voltage induced stress on the battery when the actual rate of decreasing charge capacity is greater than the projected rate of decreasing charge capacity due to voltage induced stress.

4. The computer-implemented method of claim 1, wherein modifying the one or more variable parameters includes reducing a fast charge current used to charge the rechargeable battery in order to decrease the current induced stress on the battery when the actual rate of decreasing charge capacity is greater than the projected rate of decreasing charge capacity due to charging current induced stress.

5. The computer-implemented method of claim 4, wherein modifying the one or more variable parameters further comprises reducing a termination voltage used to charge the rechargeable battery.

6. The computer-implemented method of claim 4, wherein modifying the one or more variable parameters includes reducing a processor maximum operating frequency to decrease the discharging current induced stress on the battery.

7. The computer-implemented method of claim 1, wherein modifying the one or more variable parameters further includes modifying cooling system settings to provide higher fan speeds to further decrease the temperature induced stress on the battery.

8. The computer-implemented method of claim 1, wherein modifying the one or more variable parameters further includes modifying system power settings to modulate processor frequencies to further decrease the temperature induced stress on the battery.

9. The computer-implemented method of claim 1, wherein determining an actual rate of decreasing charge capacity of the battery includes:
   periodically collecting battery usage data, including system operating data that affects a charge capacity of the battery; and
   sending the collected battery usage data to a computer system for analysis to determine, from the collected battery usage data, conditions that prematurely age the rechargeable battery.

10. An information handling system comprising:
    a battery management unit having an embedded controller;
    a rechargeable battery having a decreasing full charge capacity;

a charger;
a computer-readable storage device embodying computer program instructions executable by a processor and configured to cause the battery management unit to:
  determine an actual rate of decreasing charge capacity of the battery;
  compare the actual rate of decreasing charge capacity to the projected rate of decreasing charge capacity to determine whether the actual rate of decreasing charge capacity is greater than the projected rate of decreasing charge capacity;
  if the actual rate of decreasing charge capacity is greater than the projected rate of decreasing charge capacity, modify one or more variable parameters to slow down the actual rate of decreasing charge capacity of the battery such that the actual rate of decreasing charge capacity remains within a range of the projected rate of decreasing charge capacity with each repeated charge and discharge;
  wherein: assigned values of the one or more variable parameters affect the rate of decreasing charge capacity; and modifying the one or more variable parameters includes changing a value of at least one variable parameter to provide updated parameter values;
  wherein, in response to the actual rate of decreasing charge capacity being greater than the projected rate of decreasing charge capacity due to discharging current induced stress, the BMU modifying the one or more variable parameters further includes the BMU reducing at least one of: a processor maximum operating frequency to decrease the current induced stress on the battery; and a number of concurrently executing applications supported; and
  charge and discharge the rechargeable battery using the modified one or more variable parameters.

11. The information handling system of claim 10, wherein to modify the one or more variable parameters, the BMU:
  determines whether the actual rate of decreasing charge capacity is greater than the projected rate of decreasing charge capacity due to voltage induced stress, charging current induced stress, discharging current induced stress, or temperature induced stress;
  reduces a termination voltage used when charging the rechargeable battery in order to decrease the voltage induced stress on the battery when the actual rate of decreasing charge capacity is greater than the projected rate of decreasing charge capacity due to voltage induced stress; and
  reduces a fast charge current used to charge the rechargeable battery in order to decrease the current induced stress on the battery when the actual rate of decreasing charge capacity is greater than the projected rate of decreasing charge capacity due to charging current induced stress.

12. The information handling system of claim 10, wherein to modify the one or more variable parameters, the BMU reduces a fast charge current and a termination voltage used to charge the rechargeable battery in order to decrease the temperature induced stress on the battery when the actual rate of decreasing charge capacity is greater than the projected rate of decreasing charge capacity due to temperature induced stress.

13. The information handling system of claim 12, wherein the BMU further modifies at least one of: cooling system settings to use higher fan speeds to further decrease the temperature induced stress on the battery; and system power settings to modulate processor frequencies to further decrease the temperature induced stress on the battery.

14. The information handling system of claim 10, wherein to determine an actual rate of decreasing charge capacity of the battery, the BMU:
  periodically collects battery usage data, including system operating data; and
  sends the collected battery usage data to a remote computer system for analysis to determine, from the collected battery usage data, conditions that prematurely age the rechargeable battery.

15. A computer-readable storage device embodying computer program code, the computer program code comprising computer executable instructions configured for:
  determining an actual rate of decreasing charge capacity of a rechargeable battery that exhibits a decreasing full charge capacity;
  comparing the actual rate of decreasing charge capacity to a projected rate of decreasing charge capacity for the battery to determine whether the actual rate of decreasing charge capacity is greater than the projected rate of decreasing charge capacity;
  if the actual rate of decreasing charge capacity is greater than the projected rate of decreasing charge capacity, modifying one or more variable parameters to slow down the actual rate of decreasing charge capacity of the battery such that the actual rate of decreasing charge capacity remains within a range of the projected rate of decreasing charge capacity, wherein modifying the one or more variable parameters includes determining whether the actual rate of decreasing charge capacity is greater than the projected rate of decreasing charge capacity due to voltage induced stress, charging current induced stress, discharging current induced stress, or temperature induced stress;
  wherein assigned values of the one or more variable parameters affect the rate of decreasing charge capacity and modifying the one or more variable parameters includes changing a value of at least one variable parameter to provide updated parameter values;
  reducing a termination voltage used when charging the rechargeable battery in order to decrease the voltage induced stress on the battery when the actual rate of decreasing charge capacity is greater than the projected rate of decreasing charge capacity due to voltage induced stress;
  reducing a fast charge current used to charge the rechargeable battery in order to decrease the current induced stress on the battery when the actual rate of decreasing charge capacity is greater than the projected rate of decreasing charge capacity due to current induced stress; and
  charging and discharging the battery utilizing the updated parameter values of the at least one variable parameter.

16. The computer-readable storage device of claim 15, wherein the computer executable instructions for modifying the one or more variable parameters due to discharging current induced stress further comprises computer executable instructions configured for: reducing at least one of a processor maximum operating frequency and a number of concurrently operating secondary devices to decrease the discharging current induced stress on the battery.

17. The computer-readable storage device of claim 15, wherein the computer executable instructions for modifying the one or more variable parameters comprises instructions configured for reducing a current fast charge and a termination voltage used to charge the rechargeable battery in order to decrease the temperature induced stress on the battery when the actual rate of decreasing charge capacity is greater than the projected rate of decreasing charge capacity due to temperature induced stress.

18. The computer-readable storage device of claim 15, wherein the computer executable instructions for modifying the one or more variable parameters comprises instructions configured for modifying at least one of: cooling system settings to use higher fan speeds to further decrease the temperature induced stress on the battery; and system power settings to modulate processor frequencies to further decrease the temperature induced stress on the battery.

19. The computer-readable storage device of claim 15, wherein the computer executable instructions for determining an actual rate of decreasing charge capacity of the battery includes instructions configured for:
- periodically collecting battery data, including system operating conditions; and
- sending the collected battery data to a remote computer system for analysis to determine operating conditions that prematurely age the rechargeable battery.

* * * * *